(12) United States Patent
Ufert

(10) Patent No.: US 8,030,637 B2
(45) Date of Patent: Oct. 4, 2011

(54) MEMORY ELEMENT USING REVERSIBLE SWITCHING BETWEEN SP2 AND SP3 HYBRIDIZED CARBON

(75) Inventor: Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 1015 days.

(21) Appl. No.: 11/510,512

(22) Filed: Aug. 25, 2006

(65) Prior Publication Data

US 2008/0070162 A1    Mar. 20, 2008

(51) Int. Cl.
*H01L 45/00* (2006.01)
*H01L 51/00* (2006.01)
*G11C 11/21* (2006.01)
*G11C 11/56* (2006.01)

(52) U.S. Cl. ......... 257/5; 365/148; 257/40; 257/E29.17; 257/E51.025

(58) Field of Classification Search ............ 257/1, 2, 257/3, 5, 40, E29.17, E1.024, E51.025; 977/742, 977/750, 752, 943; 365/148, 153
See application file for complete search history.

(56) References Cited

U.S. PATENT DOCUMENTS

| | | | |
|---|---|---|---|
| 3,361,638 A | 1/1968 | Bokros et al. | |
| 3,692,565 A | 9/1972 | Lersmacher et al. | |
| 4,077,044 A | 2/1978 | Hayashi | |
| 4,262,039 A | 4/1981 | Gyarmati et al. | |
| 4,599,705 A | 7/1986 | Holmberg et al. | |
| 4,845,533 A | 7/1989 | Pryor et al. | |
| 5,086,014 A | 2/1992 | Miyata et al. | |
| 5,211,796 A | 5/1993 | Hansen | |
| 5,278,431 A | 1/1994 | Das | |
| 5,294,518 A | 3/1994 | Brady et al. | |
| 5,330,630 A | 7/1994 | Klersy et al. | |
| 5,341,328 A | 8/1994 | Ovshinsky et al. | |
| 5,440,507 A | 8/1995 | Brady et al. | |
| 6,139,624 A | 10/2000 | Rupp | |
| 6,180,444 B1 | 1/2001 | Gates et al. | |
| 6,194,746 B1 | 2/2001 | Gonzalez et al. | |
| 6,235,645 B1 | 5/2001 | Habuka et al. | |
| 6,392,913 B1 | 5/2002 | Sandhu | |
| 6,565,718 B1 | 5/2003 | Chour et al. | |
| 6,614,048 B2* | 9/2003 | Leuschner ............. 257/40 |
| 6,683,322 B2 | 1/2004 | Jackson et al. | |
| 6,750,469 B2* | 6/2004 | Ichihara et al. ............. 257/2 |
| 6,903,361 B2 | 6/2005 | Gilton | |
| 6,937,505 B2* | 8/2005 | Morikawa ............. 365/158 |
| 7,045,175 B2 | 5/2006 | Fujimaki et al. | |
| 7,052,757 B2 | 5/2006 | Chaiken et al. | |

(Continued)

FOREIGN PATENT DOCUMENTS

CN          1466218 A        1/2004

(Continued)

OTHER PUBLICATIONS

Takai, K. et al., "Structure and Electronic Properties of a Nongraphitic Disordered Carbon System and its Heat-Treatment Effects," Physical Review B 67,214202, Jun. 19, 2003, pp. 1-11.

(Continued)

*Primary Examiner* — Lynne A Gurley
*Assistant Examiner* — Andrew O Arena

(57) ABSTRACT

An information storage element has a carbon storage material including hexagonally bonded carbon and tetrahedrally bonded carbon. The information is formed by a changeable ratio of hexagonally bonded carbon and tetrahedrally bonded carbon.

24 Claims, 7 Drawing Sheets

U.S. PATENT DOCUMENTS

| | | | |
|---|---|---|---|
| 7,186,380 | B2 | 3/2007 | Chen et al. |
| 7,220,982 | B2 | 5/2007 | Campbell |
| 7,268,077 | B2 | 9/2007 | Hwang |
| 7,332,262 | B2 | 2/2008 | Latchford et al. |
| 7,339,811 | B2 | 3/2008 | Nejad et al. |
| 7,344,946 | B2 | 3/2008 | Moore et al. |
| 7,433,253 | B2 | 10/2008 | Gogl et al. |
| 7,453,716 | B2 | 11/2008 | Kim et al. |
| 7,492,635 | B2 | 2/2009 | Kim et al. |
| 7,539,038 | B2 | 5/2009 | Lee et al. |
| 7,626,190 | B2 | 12/2009 | Seidl |
| 7,692,175 | B2 | 4/2010 | Pinnow et al. |
| 2005/0127524 | A1 | 6/2005 | Sakamoto et al. |
| 2005/0201143 | A1 | 9/2005 | Pinnow et al. |
| 2005/0274942 | A1 | 12/2005 | Kozicki |
| 2006/0038212 | A1 | 2/2006 | Moore et al. |
| 2006/0152961 | A1 | 7/2006 | Kim et al. |
| 2006/0256608 | A1 | 11/2006 | Chen et al. |
| 2007/0045615 | A1 | 3/2007 | Cho et al. |
| 2008/0070162 | A1 | 3/2008 | Ufert |
| 2008/0099752 | A1 | 5/2008 | Kreupl et al. |
| 2008/0101121 | A1 | 5/2008 | Kreupl |

FOREIGN PATENT DOCUMENTS

| | | | |
|---|---|---|---|
| DE | 43 19 268 A1 | 12/1993 | |
| DE | 692 14 846 T2 | 2/1997 | |
| DE | 198 56 295 C2 | 6/2002 | |
| DE | 103 06 076 A1 | 8/2004 | |
| DE | 103 45 393 A1 | 5/2005 | |
| DE | 10 2004 006 544 B3 | 9/2005 | |
| DE | 10 2004 011 363 A1 | 9/2005 | |
| EP | 0 269 225 A2 | 6/1988 | |
| EP | 0 457 508 A2 | 11/1991 | |
| EP | 0 519 472 A2 | 6/1992 | |
| EP | 0 714 136 A1 | 5/1996 | |
| EP | 1 892 722 A1 | 2/2008 | |
| JP | 05-315595 | 11/1993 | |
| JP | 2008153624 A | 7/2008 | |
| KR | 10-2004-0111563 | 12/2004 | |
| KR | 10-0630437 | 9/2006 | |
| WO | WO 98/45847 | 10/1998 | |
| WO | WO 2004/070735 A1 | 8/2004 | |
| WO | WO 2005/081296 A1 | 9/2005 | |

OTHER PUBLICATIONS

Seo, S. et al., "Reproducible Resistance Switching in Polycrystalline NiO Films," Applied Physics Letters, vol. 85, No. 23, Dec. 6, 2004; pp. 5655-5657.

Hiatt, W.R. et al., "Bistable Switching in Niobium Oxide Diodes," Applied Physics Letters, vol. 6, No. 6, Mar. 15, 1965, pp. 106-108.

Gibbons, J.F. et al., "Switching Properties of Thin NiO Films," Solid-State Electronics, vol. 7, Mar. 30, 1964, pp. 785-797.

Argall, F., "Switching Phenomena in Titanium Oxide Thin Films," Solid-State Electronics, vol. 11, Jul. 27, 1967, pp. 535-541.

Seo, S. et al., "Conductivity Switching Characteristics and Reset Currents in NiO Films," Applied Physics Letters 86,093509, Feb. 25, 2005, pp. 1-3.

Baek, I.G. et al., "Highly Scalable Non-Volatile Resistive Memory Using Simple Binary Oxide Driven by Asymmetric Uni-polar Voltage Pulses," IEDM 2004, 26 pages.

Gerstner, E.G. et al., "Nonvolatile Memory Effects in Nitrogen Doped Tetrahedral Amorphous Carbon Thin Films," Journal of Applied Physics, vol. 84, No. 10, Nov. 15, 1998, pp. 5647-5651.

Liu, L., et al., "Controllable Reversibility of an $sp^2$ to $sp^3$ Transition of a Single Wall Nantube under the Manipulation of an AFM Tip: A Nanoscale Electromechanical Switch?," Physical Review Letters, vol. 84, No. 21, May 22, 2000, pp. 4950-4953.

Gerstner, E.G., "Bistability in a-C for memory and antifuse applications," Jun. 2001, pp. 318-323.

McKenzie, D. R., et al., "Applications of tetrahedral amorphous carbon in limited volatility memory and in field programmable gate arrays," Diamond and Related Materials, vol. 10, 2001, pp. 230-233.

Bhattacharyya, S., et al., "Resonant tunnelling and fast switching in amorphous-carbon quantum-well structures," Nature Materials, Jan. 2006, pp. 19-22, vol. 5, www.nature.com/naturematerials, Nature Publishing Group.

Savvides, N., "Four-fold to three-fold transition in diamond-like amorphous carbon films: A study of optical and electrical properties," Journal of Applied Physics, Jul. 1, 1985, pp. 518-521, vol. 58 (1), American Institute of Physics.

English Translation of Korean Office Action, Application No. 10-2007-0085471, Sep. 26, 2008, 2 pages.

Aichmayr, G., et al., "Carbon/High-k Trench Capacitor for the 40nm DRAM Generation," Symposium on VLSI Technology Digest of Technical Papers, 2007, pp. 186-187.

Raghavan, G., et al., "Polycrystalline Carbon: A Novel Material for Gate Electrodes in MOS Technology," Japan Journal of Applied Physics, Jan. 1993, pp. 380-383, vol. 32, Part 1, No. 1B.

Oberlin, A., "Pyrocarbons," Elsevier Science Ltd., Carbon 40, May 15, 2001, pp. 7-24.

Davanloo, F., et al., "Amorphic Diamond/Silicon Semiconductor Heterojunctions Exhibiting Photoconductive Characteristics," Applied Physics Letters, American Institute of Physics, Sep. 18, 2000, vol. 77, No. 12.

Lu, W., et al., "Ohmic Contact Behavior of Carbon Films on SIC," Journal of the Electrochemical Society, Jan. 23, 2003, pp. G177-G182.

\* cited by examiner

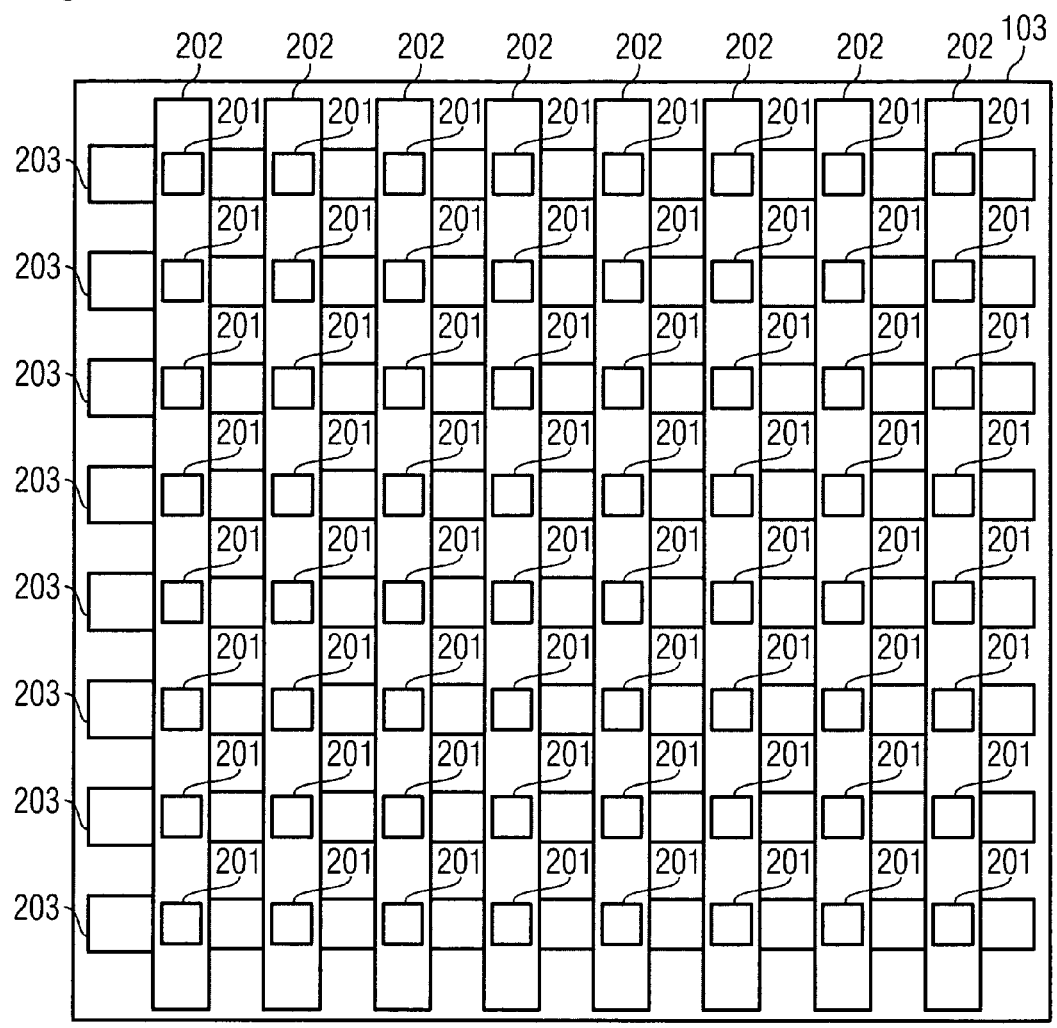

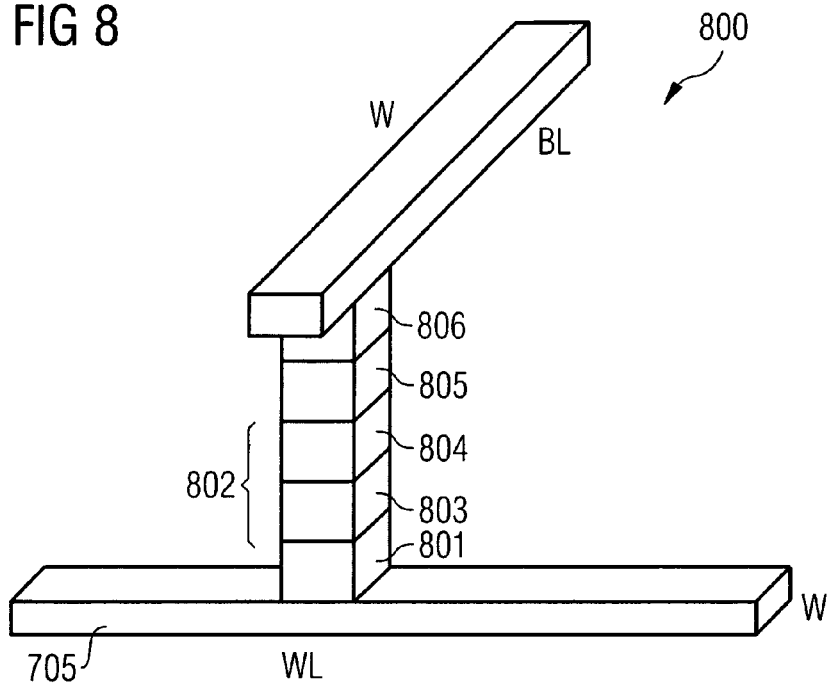
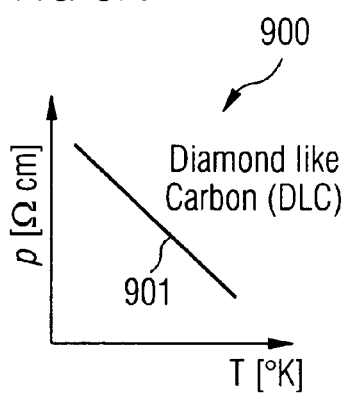
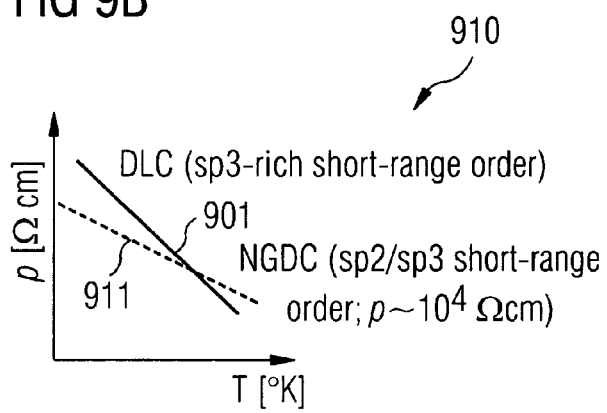

MEMORY ELEMENT USING REVERSIBLE SWITCHING BETWEEN SP2 AND SP3 HYBRIDIZED CARBON

TECHNICAL FIELD

The invention relates to information storage elements and methods of manufacturing thereof.

BACKGROUND

Common volatile memory devices, such as dynamic random access memory devices (DRAM), and non-volatile memory devices, such as flash memory devices, e.g., floating gate memory devices or charge-trapping memory devices, are used in modem computer systems for storing information.

The demand for continuously increasing storage capacity occurs due to new applications such as multimedia data storage and transmission, such as the storage of video data or audio data on mobile devices.

However, the common memory techniques will reach a limit with regard to its scaling and manufacturing costs.

SUMMARY OF THE INVENTION

In accordance with an embodiment of the invention, an information storage element is provided, comprising a carbon storage material including hexagonally bonded carbon and tetrahedrally bonded carbon, the information being formed by a changeable ratio of hexagonally bonded carbon and tetrahedrally bonded carbon.

An embodiment of the invention clearly achieves an information storage element with improved scalability.

These and other features of the invention will be better understood when taken in view of the following drawings and a detailed description.

BRIEF DESCRIPTION OF THE DRAWINGS

For a more complete understanding of the present invention, and the advantages thereof, reference is now made to the following descriptions taken in conjunction with the accompanying drawing, in which:

FIG. 2 illustrates a memory matrix of the information storage device of FIG. 1 in accordance with an embodiment of the present invention;

FIG. 8 illustrates a cross-section of an information storage element in accordance with yet another embodiment of the present invention;

FIGS. 9A and 9B illustrate symbolic resistance-temperature characteristics of a diamond-like carbon material (FIG. 9A) and a non-graphitic disordered carbon material in accordance with an embodiment of the present invention;

DETAILED DESCRIPTION OF ILLUSTRATIVE EMBODIMENTS

Figure 1:
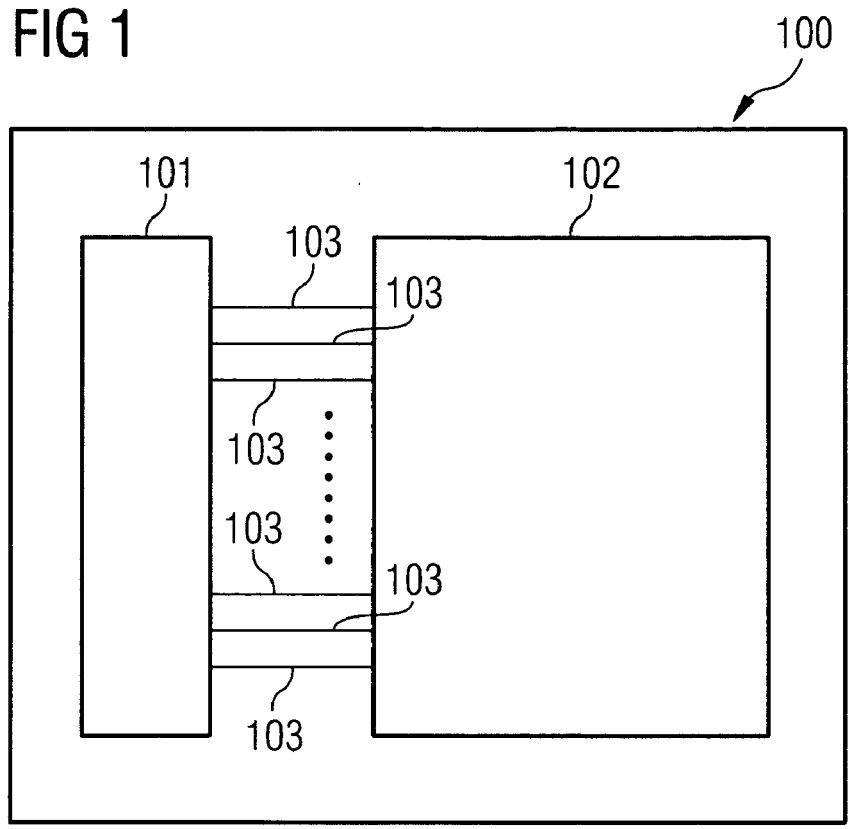
FIG. 1 illustrates an information storage device in accordance with an embodiment of the present invention.

In an embodiment of the invention, an information storage element comprises carbon including $sp^2$ hybridized carbon and $sp^3$ hybridized carbon, the information being formed by a changeable ratio of $sp^2$ hybridized carbon and $sp^3$ hybridized carbon.

The ratios may be reversibly changeable.

The carbon storage material may be substantially free of nitrogen and hydrogen.

Furthermore, the carbon storage material may include a carbon layer or at least one carbon nanotube.

In case that the carbon includes a carbon nanotube, the carbon nanotube may have a length of approximately 1 nm to several hundred nanometers and a diameter of approximately 1 nm to several tens of nm, e.g., approximately 1 nm to 20 nm, e.g., approximately 1 nm to 5 nm. The carbon nanotube may be a single wall carbon nanotube or a multi-wall carbon nanotube. Further, the carbon nanotube may be doped or undoped with doping atoms. It should be mentioned that also a plurality of carbon nanotubes may be provided in the carbon storage material.

In another embodiment of the invention, an information storage element comprises a carbon layer arrangement having an $sp^2$-rich carbon bonding structure in a first information storage status and having an increased $sp^3$ carbon bonding structure in a second information storage status.

In another embodiment of the invention, an information storage element is provided, comprising a carbon storage material having a changeable short-range order, the information being formed in a first short-range order or in a second short-range order, the second short-range order having different electrical properties than the first short-range order.

The short-range orders may be reversibly changeable.

In an exemplary embodiment of the invention, the first short-range order and the second short-range order may have substantially the same chemical composition. Generally speaking, the hexagonally bonded carbon and tetrahedrally bonded carbon, in other words, the $sp^2$ hybridized carbon and $sp^3$ hybridized carbon, may have substantially the same chemical composition.

The electrical properties may be the electrical resistance of the carbon storage material. In other words, the electrical resistance of the carbon storage material may be the characteristic that is used for storing information in a non-volatile manner. In a first status, the information storage element, in the following also referred to as memory element.

In yet another embodiment of the invention, an information storage element is provided, comprising a carbon layer arrangement comprising at least a first carbon layer having a diamond-like short-range order and at least a second layer having a graphite-like short-range order.

In this embodiment, at least one additional first carbon layer may have a diamond-like short-range order. Furthermore, at least one additional second carbon layer may have a graphite-like short-range order.

Moreover, a plurality of alternating first carbon layers and second carbon layers may be provided. In other words, a stack of first carbon layers and second carbon layers may be provided, wherein a first carbon layer is provided on a second carbon layer, another second carbon layer is provided on the first carbon layer, another first carbon layer is provided on the other second carbon layer, and so on.

The carbon layer arrangement may have a total thickness in the range of 20 nm to 120 nm, e.g., a total thickness in the range of 30 nm to 80 nm.

In an exemplary embodiment of the invention, the carbon layer arrangement may further comprise a first graphite-like layer on one end portion of the carbon layer arrangement. Further, the carbon layer arrangement may comprise a second graphite-like layer on the other end portion of the carbon layer arrangement opposing the one end portion. Clearly, the carbon layer arrangement, e.g., the stack of first carbon layers and second carbon layers may have capping layers made of graphite-like material on either of both ends of the stack or on both ends of the stack.

In another embodiment of the invention, an information storage element is provided, comprising carbon including $sp^2$ hybridized carbon clusters and $sp^3$ hybridized carbon clusters, the information being formed by a changeable ratio of $sp^2$ hybridized carbon clusters and $sp^3$ hybridized carbon clusters.

In yet another embodiment of the invention, an information storage element is provided, comprising carbon including $sp^2$ bonded carbon clusters and $sp^2/sp^3$ bonded carbon mix clusters, the information being formed in the changeable ratio of $sp^2$ bonded carbon clusters and $sp^2/sp^3$ bonded carbon mix clusters.

In yet another embodiment of the invention, an information storage element is provided, comprising a carbon storage material including hexagonally bonded carbon and tetrahedrally bonded carbon, the carbon having, in a first storage status, a first amount of hexagonally bonded carbon, a first amount of tetrahedrally bonded carbon, and having first electrical properties, and, in a second storage status, a second amount of hexagonally bonded carbon clusters a second amount of tetrahedrally bonded carbon, and having second electrical properties, the second electrical properties being different from the first electrical properties.

In yet another embodiment of the invention, an information storage array is provided, comprising a plurality of information storage cells, each information storage cell comprising an information storage element comprising a carbon storage material including hexagonally bonded carbon and tetrahedrally bonded carbon, the information being formed in the changeable ratio of hexagonally bonded carbon and tetrahedrally bonded carbon, and a selection unit individually selecting the information storage element within the information storage array.

Generally speaking, the information storage element can be configured in any way as described above and in the following.

The information storage array may further comprise at least one first control line (generally, an arbitrary number of first control lines), at least one second control line (generally, an arbitrary number of second control lines), wherein the number of first control lines may be equal to or different from the number of second control lines. The first control lines may also be referred to as bitlines (or wordlines) and the second control lines may also be referred to as wordlines (or bitlines). Each information storage cell may be arranged between a respective first control line and a respective second control line. Thus, clearly a crosspoint information storage array is provided, in which the respective information storage cells (also referred to as memory cells in the following) are located at the crosspoints of a respective first control line and a respective second control line.

The selection unit may comprise or may be at least one selection diode or at least one selection transistor.

In the embodiment, where the selection unit comprises or is at least one selection diode, the selection diode may be arranged between a respective first control line and a respective second control line, in other words, the selection diode may be integrated into the layer stack that is provided between a respective first control line and a respective second control line.

In accordance with yet another embodiment of the invention, a method of manufacturing an information storage element is provided. First and second electrodes are provided. A carbon storage material includes hexagonally bonded carbon and tetrahedrally bonded carbon between the first electrode and the second electrode with the ratio of hexagonally bonded carbon and tetrahedrally bonded carbon being changeable, thereby changing the information stored in the information storage element.

In accordance with yet another embodiment of the invention, a method of manufacturing an information storage element is provided. A carbon storage material that includes hexagonally bonded carbon and tetrahedrally bonded carbon is provided. The information is formed by a changeable ratio of hexagonally bonded carbon and tetrahedrally bonded carbon.

The providing of the carbon storage material may comprise depositing the carbon storage material.

Further, the depositing of the carbon storage material may comprise depositing of the carbon storage material using a chemical vapor deposition process.

Furthermore, the depositing of the carbon storage material may comprise depositing of the carbon storage material using a plasma-enhanced chemical vapor deposition process.

The depositing of the carbon storage material may comprise depositing of the carbon storage material using an atomic layer deposition chemical vapor deposition process. The depositing of the carbon storage material may further comprise depositing of the carbon storage material using a chemical vapor deposition process using a $C_xH_y$ reaction gas.

In accordance with yet another embodiment of the invention, a method of operating an information storage element is provided. The information storage element includes a carbon storage material including hexagonally bonded carbon and tetrahedrally bonded carbon. The information is formed in the changeable ratio of hexagonally bonded carbon and tetrahedrally bonded carbon. The method includes changing the ratio of hexagonally bonded carbon and tetrahedrally bonded carbon, thereby changing the information storage status of the information storage element.

According to an exemplary embodiment of the invention, a non-volatile memory element is provided having a good scalability (in nanoscale dimensions), low switching voltages and short switching times.

The resistive non-volatile memory element in accordance with one exemplary embodiment of the invention is based on the change of its electrical resistance. This is comparable with the change of the electrical resistance occurring in transition metal oxide layers, but the change of the electrical resistance occurs, in accordance with an embodiment of the invention, in a non-graphitic disordered (quasi amorphous) carbon system. According to an embodiment of the invention, dependent on the temperature of the carbon storage material, highly conductive filament regions may be formed. In other words, the formation of highly conductive filament regions is based on a thermistor effect, which induces a bistable resistance switching in the long-range disordered carbon layer when applying an electrical voltage due to the inhomogeneous temperature distribution (Joule heating).

The non-graphitic disordered carbon (NGDC) layer has the advantage that in a chemical substance being in a quasi amorphous state the electrical conductivity of the non-graphitic disordered carbon layer can be varied by several magnitudes without changing the crystal structure (e.g., from amorphous to crystalline or vice versa) only by varying the ratio of the amount of the $sp^2$ bonds (graphite-like conductor) and the $sp^3$ bonds (diamond-like insulator) in an atomically scaled region.

NGDC can generate a region having a negative differential resistance and a bistable switching in the I-U-characteristics when a sufficient and adequate electrical voltage is applied to the NGDC due to the thermistor effect $$(\sigma \propto e^{-\frac{\Delta E}{kT}})$$

and due to the steepness of the resistance-temperature-characteristic. In the "On"-state, the $sp^2$-rich bonding structure is dominating in the short-range order. In the "Off"-state, the amount of $sp^2$ bondings is reduced in relation to the $sp^3$ bondings or to the $sp^2/sp^3$ mixed cluster bondings.

For example, using unipolar switching, in some embodiments the NGDC may be switched to the "Off" state through application of a short, high current pulse. A pulse having a current density of approximately $10^9$ A/cm$^2$, at 1 V or less per nm of thickness of the NGDC, applied over approximately 5 to 50 ns, may be sufficient to destroy the highly conductive filaments, effectively switching the NGDC to the "Off" state. A longer, lower pulse may be used to switch the NGDC to the "On" state. For example, in some embodiments, a pulse having a current density of approximately $10^6$ A/cm$^2$, at 1 V or less per nm of thickness of the NGDC, applied over 200 to 300 ns, may provide appropriate heating for the formation of highly conductive filament regions in the NGDC, switching the NGDC to the "On" state. Alternatively, in some embodiments, bi-polar switching, using pulses having opposite voltage polarities, may be used to switch between the "On" and "Off" states.

Up to now, bistable memory switching in transition metal oxides has been provided only in together with chemical conversion in a narrow filament, wherein the respective layer in which the conversion takes place, has been destroyed after a limited number of conversion cycles. By way of example, when using $NiO_{1-x}$ layers as memory material, $10^6$ write cycles and $10^{12}$ read cycles have been realized, but it is difficult to adjust the optimal lack of oxygen within the layer and to keep the lack of oxygen constant compared with oxidizing and reducing impacts.

One embodiment of the invention is based on a memory concept in NGDC and further on the combination of amorphous carbon (diamond-like carbon, DLC) with graphite, wherein amorphous carbon and graphite differ from each other mainly with respect to the bonding ratios, in other words with respect to the number of the $sp^3$ hybridized clusters and/or the $sp^3/sp^2$ hybridized mixed clusters compared with pure $sp^2$ hybridized clusters and not so much with respect to the chemical composition, thereby enabling a substantially greater number of switching cycles.

The non-graphitic disordered carbon layer/graphite layer alternating layer arrangement provided according to an embodiment of the invention has the advantage that it is now possible to vary the resistance and thus the electrical conductivity and the temperature dependency of a material system including an NGDC layer in a broad range. In this context it should be noted that this is possible to adjust the resistance and thus the electrical conductivity and the temperature dependency merely by setting the ratio of the $sp^3$ bondings and the $sp^2$ bondings on atomic level (in atomic scale), without varying the chemical composition.

FIG. 1 shows an information storage device 100 in accordance with an exemplary embodiment of the invention. The information storage device 100 comprises, inter alia, a read/write circuit 101 and a memory matrix 102, also referred to as a memory array, including a plurality of memory cells 201 (see FIG. 2), which are arranged in a plurality of rows and columns of the memory matrix 102. The read/write circuit 101 is configured to control the reading of data that is stored in the memory cells 201 and to control the writing of data into the memory cells 201. The information storage device 100 further comprises external interfaces (not shown) for useful data transfer and for control data transfer. The read/write circuit 101 is connected with the memory matrix 102 and therewith with the plurality of memory cells 201 by means of connecting lines 103, e.g., by means of bitlines 202 and wordlines 203. It should be mentioned that in alternative embodiments, other arrangements of the memory cells 201 within the memory matrix 102 are provided, for example, the memory cells 201 can be arranged in a triangular form or in any other suitable arrangement.

According to an exemplary embodiment of the invention, the memory cells 201 are arranged between a respective bitline 202 and a respective wordline 203. In other words, according to an exemplary embodiment of the invention, the memory cells 201 are arranged or integrated in a crosspoint array structure within the memory matrix 102, although other architectures may be provided as desired.

In the crosspoint array structure, a one transistor one resistor structure (1T1R) can be provided, wherein one select transistor is provided for each resistive memory cell 201 within the memory array 102.

Figure 3:
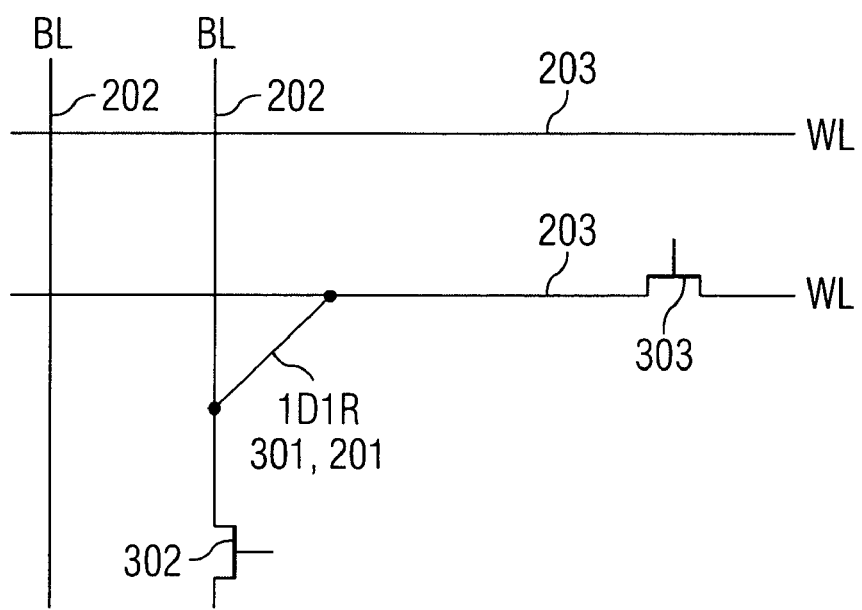
FIG. 3 illustrates a circuit diagram of a 1-Diode-1-Resistive Memory Element in accordance with an embodiment of the present invention.

In an alternative embodiment of the invention, a one diode one resistor structure (1D1R) can be provided in the crosspoint array structure as shown in FIG. 3. The 1D1R structure has the advantage that enables a higher memory cell density within the memory array 102 as will described in more detail below. As shown in FIG. 3, the respective memory cell 201 is arranged between one bitline 202 and one wordline 203 together with at least one diode 301.

Furthermore, one first select transistor 302 is provided in each bitline 202 in order to individually select the desired bitline 202 and one second select transistor 303 is provided in each wordline 203 in order to individually select the desired wordline 203.

Figure 4:
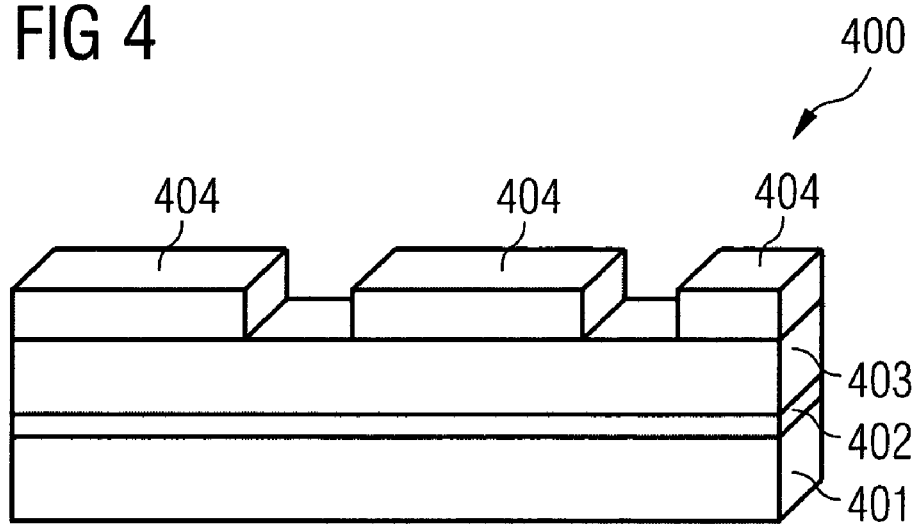
FIG. 4 illustrates a cross-section of an information storage element in accordance with an embodiment of the present invention.

FIG. 4 illustrates a cross-section of an information storage element 400 as a memory cell 201 in accordance with an embodiment of the present invention.

The information storage element 400 is formed on a substrate 401, for example made of silicon. As will be described in more detail below, a bottom contact 402 (for example made of tungsten (W) or tungsten silicide (WSi), in general made of any suitable metal such as titanium nitride (TiN) or tungsten titanium (WTi)) is deposited on the silicon substrate 401. Further, on the upper surface of the bottom contact 402, there is provided a mixed carbon layer 403 made of non-graphitic disordered carbon, the production of which will be described in more detail below. Then, a top contact 404 (for example made of tungsten (W) or tungsten silicide (WSi), in general made of any suitable metal such as titanium nitride (TiN) or tungsten titanium (WTi)) is deposited on the mixed carbon layer 403. The bottom contact 402 may be connected to a respective wordline 203 and the top contact 404 may be connected to a respective bitline 202. The bitlines 202 as well as the wordlines 203 can be made of copper (Cu) or aluminum (Al) in all exemplary embodiments that are described.

Figure 5:
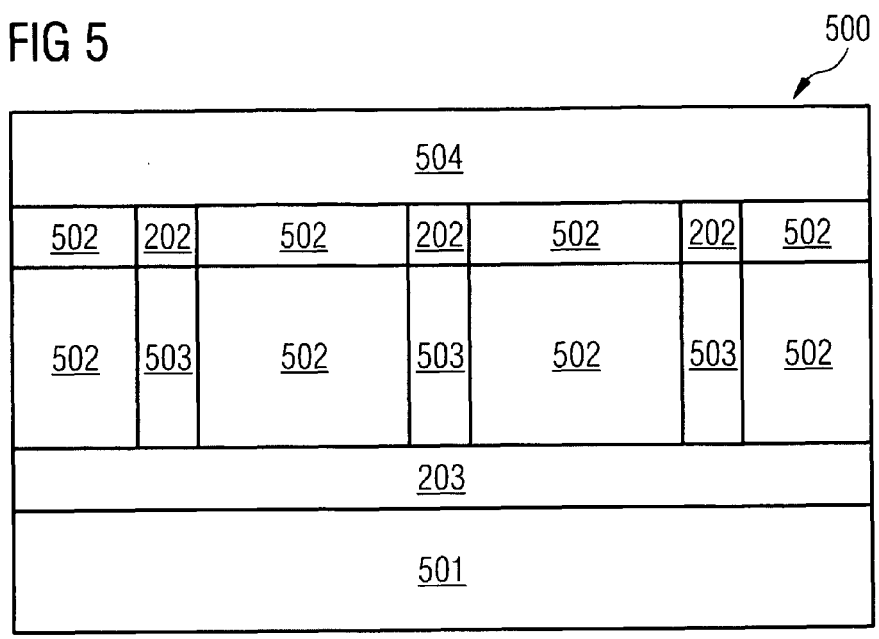
FIG. 5 illustrates a cross-section of an information storage element in accordance with another embodiment of the present invention.

FIG. 5 illustrates a cross-section of an information storage element 500 as a memory cell 201 in accordance with another embodiment of the present invention.

The information storage element 500 is formed on a substrate 501, for example made of silicon. As will be described in more detail below, a wordline 203 is provided on the substrate 501. Moreover, an intermetal dielectric layer 502, e.g., made of silicon dioxide or silicon nitride or any other suitable dielectric material, e.g., a low-k dielectric material, is applied on the upper surface of the structured wordlines 203 and the substrate 501. Vias (holes) are etched through the intermetal dielectric layer 502 such that at least a part of a respective wordline 203 is exposed by the via. Next, one or a plurality of carbon nanotubes 503 (single-wall or multi-wall) are grown in the vias on the upper surface of the exposed wordlines 203, optionally on a seed layer (e.g., made of nickel iron (NiFe)) that has been deposited on the upper surface of the exposed wordlines 203 before the growth of the carbon nanotubes 503. In an exemplary embodiment of the invention, the carbon nanotubes 503 have a length of approximately 20 nm to approximately 120 nm, e.g., a length of approximately 30 nm to approximately 80 nm, e.g., a length of approximately 40 nm.

After the growth of the carbon nanotubes 503 has been completed, bitlines 202 are deposited in the vias and are connected to the carbon nanotubes 503. On top of the bitlines 202, a passivation layer 504 made of silicon dioxide is deposited.

Figure 6:
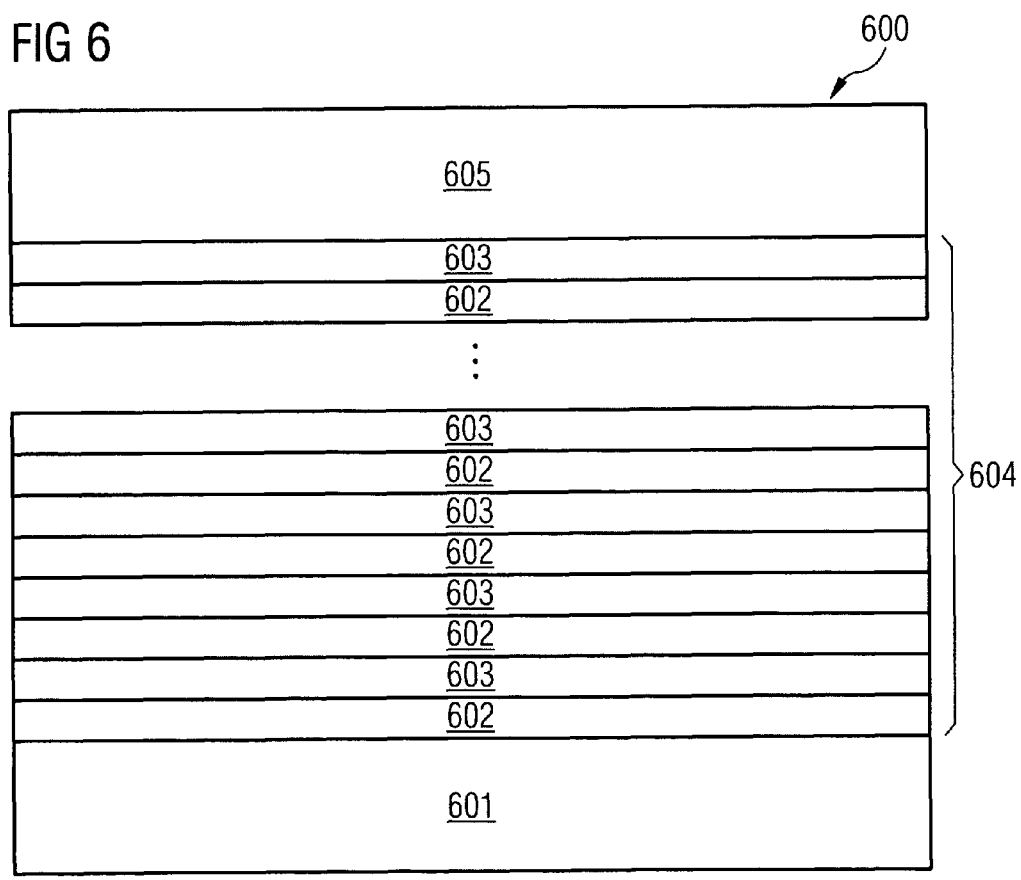
FIG. 6 illustrates a cross-section of an information storage element in accordance with yet another embodiment of the present invention.

FIG. 6 illustrates a cross-section of an information storage element 600 as a memory cell 201 in accordance with yet another embodiment of the present invention.

The information storage element 600 has a bottom contact 601 made of tungsten or any of the above-mentioned alternative materials, a non-graphitic disordered carbon (NGDC) layer arrangement 604 comprising a plurality of alternatingly arranged first NGDC layers 602 and second NGDC layers 603. Each first NGDC layer 602 of the plurality of first NGDC layers 602 is formed in a first short-range order having a first ratio of $sp^2$ hybridized carbon and $sp^3$ hybridized carbon and has a conductivity $\rho$ of approximately $10^4$ $\Omega$cm. Each second NGDC layer 603 of the plurality of second NGDC layers 603 is formed in a second short-range order having a second ratio of $sp^2$ hybridized carbon and $sp^3$ hybridized carbon, wherein the portion of $sp^3$ hybridized carbon is increased. In other words, the second NGDC layers 603 have $sp^3$ rich carbon and clearly includes diamond-like carbon (DLC). The NGDC layer arrangement 604 may have an arbitrary number of first NGDC layers 602 and second NGDC layers 603 being interposed between the first NGDC layers 602, respectively. In an exemplary embodiment of the invention, NGDC layer arrangement 604 has a total thickness of approximately 20 nm to approximately 120 nm, e.g., a total thickness of approximately 30 nm to approximately 80 nm, e.g., a total thickness of approximately 40 nm. Moreover, a top contact 605 made of tungsten or any of the above-mentioned alternative materials, is provided on the upper surface of the NGDC layer arrangement 604, in FIG. 6 on the upper surface of the uppermost second NGDC layer 603.

FIG. 7A to FIG. 7F illustrate a cross-sectional view of an information storage element during different points in time of the manufacturing of its structured bottom contact, also referred to as bottom electrode.

Figure 7A:
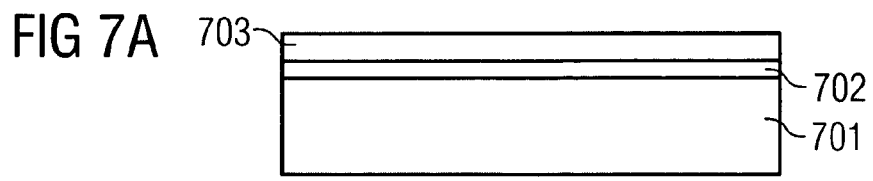
FIGS. 7A to 7F illustrate a cross-sectional view of an information storage element during different points in time of the manufacturing of its bottom contact.

As shown in FIG. 7A the process starts with a pre-cleaned silicon wafer 701. According to these exemplary embodiments of the invention, the process for manufacture the silicon electrode structure is carried out based on the complementary metal oxide semiconductor (CMOS) technology, which provides adequate contact lines, which are required in some applications. The upper surface of the silicon wafer 701 is oxidized (not shown) and a silicon nitride layer 702 is deposited on the oxidized surface of the silicon wafer 701. Next, an additional silicon dioxide layer 703 is deposited on the upper surface of the silicon nitride layer 702.

Figure 7B:
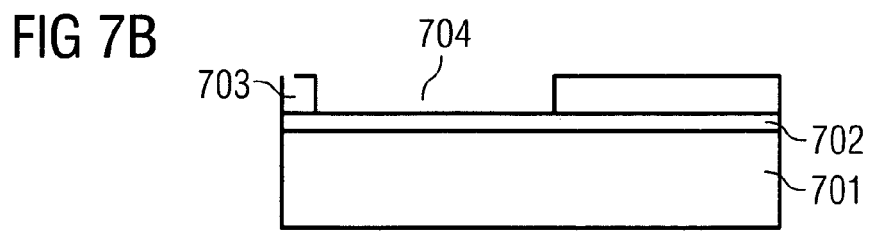
Figure 7C:
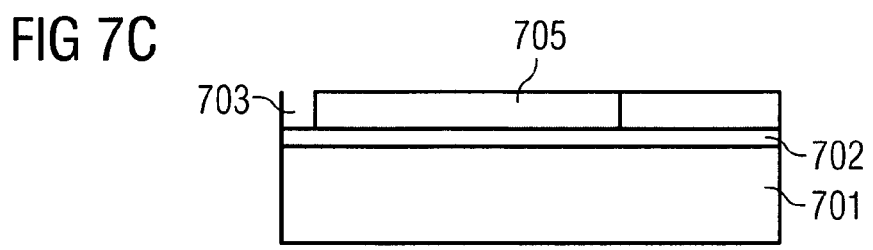

Next, as shown in FIG. 7B, a hole 704 is etched using metallization plane 0 lithography, the etching being stopped on the upper surface of the silicon nitride layer 702, which serves as an etch stop layer in this case.

In a following step, tungsten is deposited on the exposed regions, i.e., on the upper surface of the additional silicon dioxide layer 703 and the sidewalls and the bottom of the holes formed in the previous step. The overfilling tungsten is then removed by means of a chemical mechanical polishing (CMP) method, thereby forming a first portion 705 of the bottom electrode to be formed (see FIG. 7C).

Figure 7D:
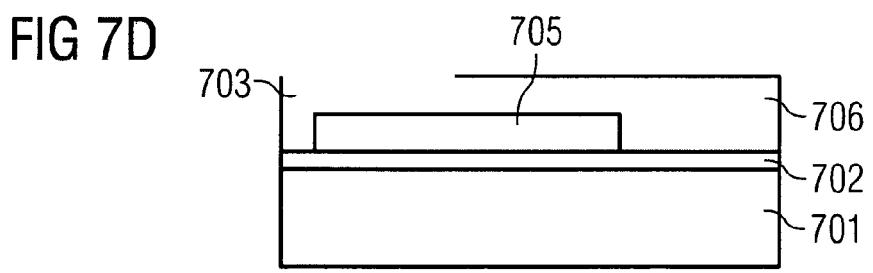

As shown in FIG. 7D, an intermetal dielectric layer 706 made of silicon dioxide or silicon nitride, for example, is deposited on the upper surface of the additional silicon dioxide layer 703 and the exposed upper surface of the first portion 705 of the bottom electrode to be formed.

Figure 7E:
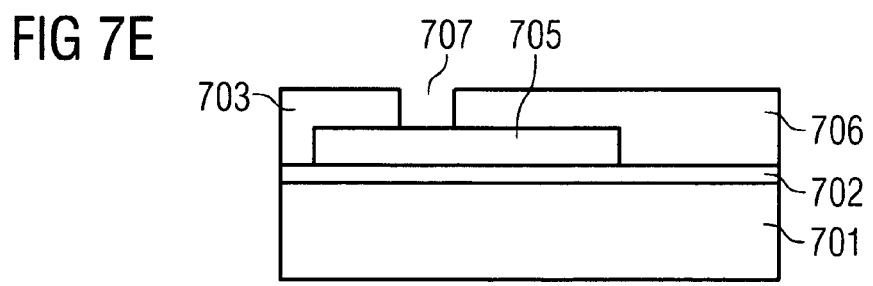

Next, as shown in FIG. 7E, a contact hole 707 is etched by means of a so-called contact hole 1 (C1) lithography and etching. According to these exemplary embodiments of the invention, the formed contact holes 707 are formed as sub-lithographic contact holes.

Figure 7F:
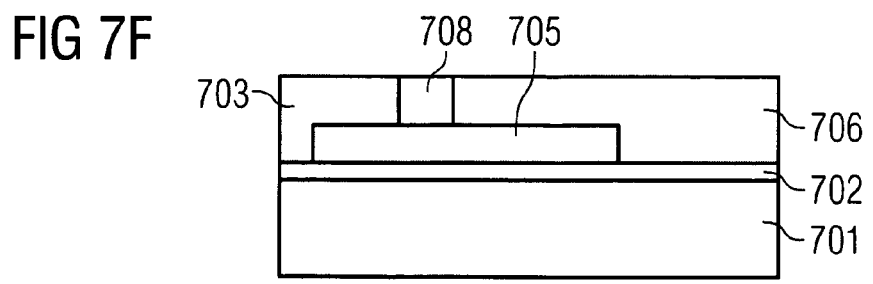

In order to complete the partial process for forming the bottom electrode(s) of the information storage element, the contact holes 707 are filled or overfilled with tungsten (e.g. using an LPCVD process (low pressure chemical vapor deposition) and the overfilling portions are removed by means of a chemical mechanical polishing (CMP) method (see FIG. 7F).

It should be mentioned that any other suitable general process for forming the bottom electrode of the information storage element can be used in the context of the embodiments of the invention.

FIG. 8 illustrates a cross-section of an information storage element 800 in accordance with another embodiment of the present invention, wherein the substrate material as well as the surrounding material (e.g., the provided dielectric material) is not shown for clarity reasons.

After having formed the bottom electrode including the wordline using the process as described with reference to FIGS. 7A to 7F, the tungsten 708 that fills the contact holes is silicided, thereby forming a silicided tungsten bottom contact 801 to the wordline, e.g., formed by the first portion 705 of the electrode to be formed as described above. The silicided tungsten bottom contact 801 has a layer thickness of approximately 10 nm to approximately 50 nm, e.g., a layer thickness of approximately 20 nm to approximately 30 nm. In an alternative embodiment of the invention, pure tungsten (W), titanium nitride (TiN) or tungsten titanium (WTi) may be used instead of the tungsten silicide (WSi). In general, any CMOS compatible suitable material can be used instead of the tungsten silicide (WSi).

Next, a CMOS diode 802 is formed on the silicided tungsten bottom contact 801, wherein the CMOS diode 802 has a first diode layer 803 and a second diode layer 804.

The first diode layer 803 of the CMOS diode 802 is formed by depositing polysilicon by means of LPCVD on the upper surface of the silicided tungsten bottom contact 801. During the deposition of polysilicon, an in-situ doping is provided using phosphorous doping atoms in such a way that a doping gradient is set, beginning with a concentration of greater than approximately $10^{20}$ cm$^{-3}$ (n$^+$ doping) for providing a low ohmic resistance to the tungsten silicide of the silicided tungsten bottom contact 801. The concentration is changed to a concentration of approximately $10^{17}$ cm$^{-3}$ (n$^-$ doping) for providing a Schottky diode to the second diode layer 804 to be formed. The first diode layer 803 is deposited with a thickness of approximately 30 nm to approximately 70 nm, by way of example approximately 50 nm.

Next, the second diode layer 804 is formed as will be described in more detail below. According to an exemplary embodiment of the invention, a layer made of platinum silicide (PtSi) is formed as the second diode layer 804. The platinum silicide layer is produced in a plurality of process steps. To begin with, polysilicon is deposited on the upper surface of the first diode layer 803, i.e., on the n-side of the doped polysilicon layer 803, by means of an LPCVD. Next, platinum is deposited on the polysilicon layer by means of dc sputtering. Then, both layers that have been formed are processed together by means of rapid thermal annealing (RTA) at a temperature of approximately 600° C. Any other suitable process can be used to deposit the platinum silicide or another material or material compound that can be used for the second diode layer 804. The second diode layer 804 is deposited with a thickness of approximately 20 nm to approximately 50 nm, by way of example with a thickness of approximately 30 nm.

After having completed the CMOS diode 802 within the respective memory cell stack, a mixed carbon layer arrangement 805 is formed having, according to an exemplary embodiment of the invention, a thickness of approximately 20 nm to approximately 120 nm, for example a thickness of approximately 30 nm to approximately 80 nm, by way of example a thickness of approximately 40 nm. The mixed carbon layer arrangement 805 has an alternating stack of NGDC layers and graphite-like layers, beginning with a graphite-like bottom contact layer. In other words, the first layer of the mixed carbon layer arrangement 805 that is formed on the upper surface of the second diode layer 804 of the CMOS diode 802, is a graphite-like layer.

The mixed carbon layer arrangement 805, i.e., the NGDC/graphite-alternating layer arrangement, is produced as will be described in more detail below. The NGDC/graphite-alternating layer arrangement is produced by means of PECVD/ALD-deposition (plasma enhanced chemical vapor deposition/atomic layer deposition), which is carried out in an inductively coupled high-density plasma with a stimulation frequency of approximately 20 MHz to approximately 40 MHz, e.g., with a stimulation frequency of approximately 25 MHz to approximately 30 MHz, e.g., with a stimulation frequency of approximately 27,26 MHz. The substrate including the layer stack already manufactured is in this case arranged on a specific substrate holder, where it is possible to apply an RF bias voltage. The substrate can be heated. If desired, additional ions having the appropriate energy can be pulled onto the substrate by means of the RF bias voltage. In an exemplary embodiment of the invention, $C_xH_y$ (x and y are arbitrary natural number), e.g., $C_2H_2$ or $CH_4$, can be used as the reactive gas. Optionally, the reactive gas can be diluted using neon (Ne), hydrogen ($H_2$) or argon (Ar).

The level of the substrate bias voltage is determined, on the one hand, by the reactor geometry, i.e., the ratio of the dimensions of the mass carrying electrode and the rf carrying electrode in the reactor, and, on the other hand, by the self-bias, which is applied or is adjusted by the externally applied capacitively coupled-in rf field. In particular, the externally applied capacitively coupled-in rf field determines the layer characteristics and, for example, the occurring bondings like sp$^3$ bondings or sp$^2$ bondings, its relative number or amount and its mixture. In an exemplary embodiment of the invention, a negative voltage in the range of approximately 100 V and approximately 350 V is applied together with a gas pressure in the range of approximately 10 mTorr and approximately 500 mTorr.

Higher self-bias voltages and higher substrate temperatures (higher than approximately 250° C.) result in the preferred formation of preferred graphitic components and should be avoided. In an exemplary embodiment of the invention, neither the electrical properties of the pure diamond-like carbon nor the electrical properties of the pure graphite is strived for, but an electrical conductivity (or a corresponding electrical resistance) in the range of $\rho \approx 10^6$ $\Omega$cm and $10^3$ $\Omega$cm.

In order to achieve the low resistance values of the graphite in the NGDC/graphite-alternating layer arrangement 805, the self-bias voltage is decreased, the gas pressure is increased and the temperature is set to approximately 250° C., wherein other process parameters can be used in alternative embodiments of the invention.

After having completed the NGDC/graphite-alternating layer arrangement 805, i.e., after having completed the above-described PECVD/ALD-process, a layer having a predominant sp$^2$ hybridization, i.e., a predominant sp$^2$ (graphitic) short-range order, in other words, a graphite-like layer 806 is on the upper surface of the completed NGDC/graphite-alternating layer arrangement 805, thereby forming the top contact 806 of the memory cell. As an alternative material for the top contact 806 of the memory cell, platinum (Pt) or palladium (Pd) can be used or the materials that can be used for the bottom contact 801, for example, silicided tungsten (WSi), pure tungsten (W), titanium nitride (TiN) or tungsten titanium (WTi). In general, any CMOS compatible suitable material can be used for the top contact 806 of the memory cell. The top contact 806 of the memory cell has a thickness of approximately 30 nm to approximately 100 nm, e.g., a thickness of approximately 30 nm.

In a next step, a hardmask (not shown), e.g., made of tantalum nitride (TaN) is deposited on the upper surface of the top contact 806 by means of reactive dc sputtering, thereby completing the layer stack that forms the memory cell including a CMOS diode.

It should be noted that the CMOS diode 802 is an optional component within the memory cell structure. In an alternative embodiment of the invention, one or a plurality of select transistors may be provided for individually selecting the desired memory cell.

In an exemplary embodiment of the invention, the desired information is stored in the respective memory cell using the bonding ratio in the (amorphous) short-range order, which can be changed by heating (e.g., by Joule heating). The change of the bonding ratio in the short-range order, for example, the change of the ratio of sp$^2$ hybridized cluster and sp$^3$ hybridized cluster or the change of the ratio of sp$^2$ hybridized cluster and sp$^2$/sp$^3$ hybridized mixed cluster results in a non-volatile but reversible change in the electrical conductivity of the structure.

For example, NGDC can generate a region having a negative differential resistance and a bistable switching in the I-U-characteristics when a sufficient and adequate electrical voltage is applied to the NGDC due to the thermistor effect $$\left(\sigma \propto e^{-\frac{\Delta E}{kT}}\right)$$

and due to the steepness of the resistance-temperature-characteristic. In the "On"-state, the sp²-rich bonding structure is dominating in the short-range order. In the "Off"-state, the amount of sp² bondings is reduced in relation to the sp³ bondings or to the sp²/sp³ mixed cluster bondings. As described above, unipolar switching may be used, with a short, high current pulse being used to switch to the "Off" state, and a longer, lower current pulse being used to switch to the "On" state. Alternatively, bi-polar switching may be used.

The non-graphitic disordered carbon layer (NGDC)/graphite alternating layer arrangement, generally speaking an arrangement that provides a reversible non-volatile change of the ratio of sp² hybridized cluster and sp³ hybridized cluster or the change of the ratio of sp² hybridized cluster and sp²/sp³ hybridized mixed cluster in the carbon storage material that is used, has the advantage that it is possible to vary the electrical resistance (or the electrical conductivity) and its temperature dependency in a wide range, e.g., by means of the NGDC layer(s) in a material system in accordance with an exemplary embodiment of the invention.

In this context it should be noted that the change of the electrical resistance (or the electrical conductivity) can be achieved in a disordered non-graphitic network only by setting the ratio of the sp² bondings and sp³ bondings in atomic dimensions, without changing or varying the chemical composition.

In an exemplary embodiment of the invention, the changes of the short-range orders occur in a volume that is as small as possible, e.g., within the NGDC/graphite alternating layer arrangement, in order to keep the energy that is required for programming the memory cells, in other words, in order to keep the switch-on currents and the switch-off currents that are required for programming the memory cells, as small as possible.

In an exemplary embodiment of the invention, the NGDC/graphite alternating layer arrangement is enclosed in a sandwich geometry by graphite or fullerene layer electrodes. This results in a stable information storage layer system that cannot come into interaction with the adjacent material, e.g., metal or dielectric, such as the absorption of oxygen or chalcogenide material.

Another advantage of the exemplary embodiments of the invention can be seen in the fact that no filament spots occur that are in the conducting state, in which a more or less destroying chemical conversion has taken place, which limits the number of possible programming cycles in the memory element.

In an exemplary embodiment of the invention, a NGDC/graphite alternating layer arrangement (or nanotube arrangement) is provided (e.g., instead of a metal chalcogenide storage layer), in which the transition (or change) of the electrical conductivity (or the electrical resistance) is caused merely by the change of the amorphous atomic short-range order in a small filament in the NGDC/graphite alternating layer arrangement (or in the nanotube arrangement, for example) without substantially changing its chemical composition or crystal structure. The electrical conductivity and thus the optimal off-resistance $R_{off}$ and the activation energy $$\left(\sigma \propto \frac{\Delta T}{kT}\right)$$

can be optimized in a wide margin in amorphous or disordered carbon layers, which cannot be achieved in most other material systems without the need to substantially change its chemical composition.

In an exemplary embodiment of the invention, the NGDC/graphite alternating layer arrangement reduces the actual filament volume, which results in low switch-on and switch-off energies and in the fact that in principle the same chemical composition exists in both layers that are provided in the NGDC/graphite alternating layer arrangement.

Thus, in case that the low-ohmic contact material (graphite-like) should diffuse in the NGDC material in a limited amount at the filament localizations, in particular during the higher erase current pulse, in principle, the chemical composition in the channel (i.e., in the filaments) in the NGDC layer is not changed.

FIG. 9A shows a first diagram 900, which illustrates the temperature dependency of the electrical resistivity ρ (in Ωcm) of diamond-like carbon in a first characteristic curve 901.

Furthermore, FIG. 9B shows a second diagram 910, which illustrates the temperature dependency of the electrical resistivity ρ (in Ωcm) of diamond-like carbon in a first characteristic curve 901 and of an NGDC material in a second characteristic curve 911. As can be seen from FIG. 9B, the electrical resistivity of the NGDC material can be changed in a different way as compared to the electrical resistivity of the diamond-like carbon.

Figure 10:
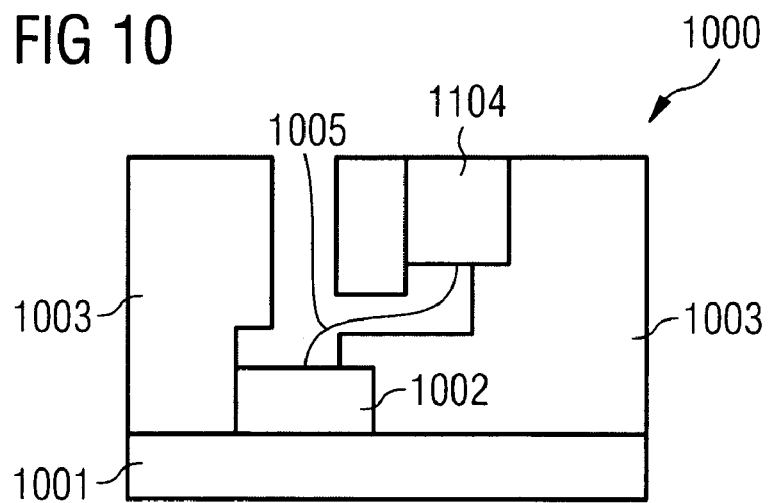
FIG. 10 illustrates a cross-section of an information storage element in accordance with yet another embodiment of the present invention.

FIG. 10 illustrates a cross-section of an information storage element 1000 in accordance with another embodiment of the present invention.

The information storage element 1000 has a silicon substrate 1001 (in an alternative embodiment of the invention, a silicon dioxide substrate) and a respective first electrode 1002, e.g., connected to or formed by a bitline. The first electrode 1002 is formed in an intermetal dielectric 1003, which is deposited on the substrate 1001 using a damascene technique. An additional intermetal dielectric 1003 (e.g., made of silicon dioxide or silicon nitride) is provided on and above the first electrode 1002. A respective second electrode 1004, e.g., connected to or formed by a wordline, is formed laterally adjacent to and above the first electrode 1002 in the additional intermetal dielectric 1003. Next, a hole is etched (e.g., isotropically) in the additional intermetal dielectric 1003, thereby exposing at least a part of the upper surface of the first electrode 1002 and at least a part of the bottom surface of the second electrode 1004. Finally, one or a plurality of carbon nanotubes (single-wall carbon nanotube(s) or multi-wall carbon nanotube(s)) is or are grown such that the one or a plurality of carbon nanotubes connects or connect the upper surface of the first electrode 1002 and the bottom surface of the second electrode 1004. The nanotubes 1005 can be switched between two conductivity states by changing its short-range order in a non-volatile manner by a respective heating or cooling.

Figure 11:
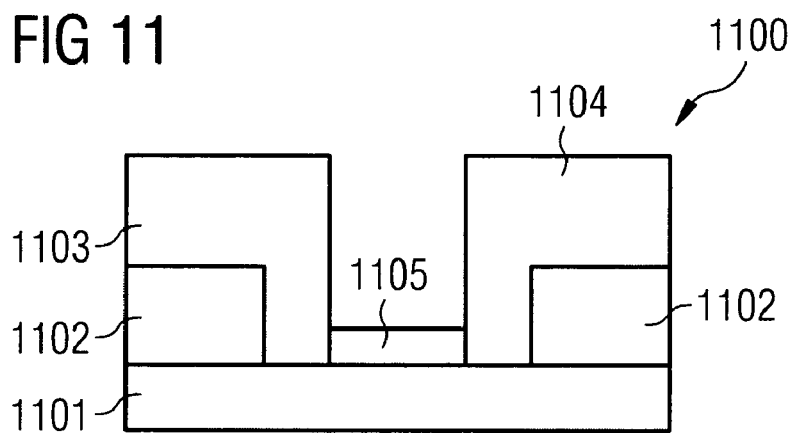
FIG. 11 illustrates a cross-section of an information storage element in accordance with yet another embodiment of the present invention.

FIG. 11 illustrates a cross-section of an information storage element 1100 in accordance with another embodiment of the present invention.

The information storage element 1100 has a silicon substrate 1101 (in an alternative embodiment of the invention, a silicon dioxide substrate) and an insulating layer 1102 (made of silicon nitride or silicon dioxide, for example). In order to form the information storage element 1100, a respective hole is etched into the insulating layer 1102 with stop on the upper surface of the substrate 1101. In a next step, a metal layer is conformally deposited on the upper surface of the insulating layer 1102 as well as on the sidewalls and the bottom of the hole, in other words, of the trench. In a following step, an anisotropic spacer etching is carried out (e.g., by means of a reactive ion etching (RIE)), thereby exposing a part of the bottom of the trench and thereby forming a first electrode 1103 (e.g., the bitline) and a second electrode 1104 (e.g., the wordline). Next, an NGDC/graphite alternating layer arrangement 1105 (or nanotube arrangement comprising one or a plurality of carbon nanotubes (single-wall carbon nanotube(s) or multi-wall carbon nanotube(s))) is deposited on the bottom of the trench, e.g., using the PECVD/ALD method as described above. The NGDC/graphite alternating layer arrangement 1105 (or the nanotube arrangement) can be switched between two conductivity states by changing its short-range order in a non-volatile manner by a respective heating or cooling. Clearly, this structure is a horizontal structure.

Figure 12:
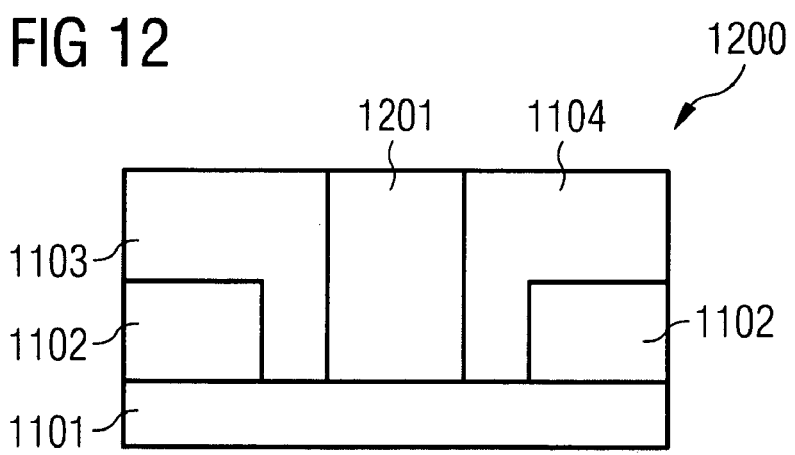
FIG. 12 illustrates a cross-section of an information storage element in accordance with yet another embodiment of the present invention.

FIG. 12 illustrates a cross-section of an information storage element 1200 in accordance with another embodiment of the present invention.

The information storage element 1200 is similar to the information storage element 1100 shown in FIG. 11 with the difference that the NGDC/graphite alternating layer arrangement 1201 fills the entire trench.

It should be noted that the above-described structures can also be turned by 90° C. so that vertical arrangements as well as planar arrangements are provided in respective exemplary embodiments of the invention.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An information storage element, comprising:
a non-graphitic disordered carbon arrangement comprising a plurality of alternatingly arranged non-graphitic disordered carbon layers, wherein at least a first layer is formed in a first short-range order having a first ratio of $sp^2$ hybridized carbon and $sp^3$ hybridized carbon and at least a second layer is formed in a second short-range order having a second ratio of $sp^2$ hybridized carbon and $sp^3$ hybridized carbon, wherein the ratios are reversibly changeable.

2. The information storage element of claim 1, wherein the arrangement is substantially free of nitrogen.

3. The information storage element of claim 1, wherein the arrangement comprises a carbon layer or at least one carbon nanotube.

4. The information storage element of claim 3, wherein the arrangement comprises a carbon nanotube, and the carbon nanotube has a length of approximately one nm to several hundred nanometers.

5. The information storage element of 1, wherein the arrangement may have an arbitrary number of first and second layers.

6. The information storage element of 1, wherein the first layer has a conductivity of approximately $10^4$ Ωcm.

7. The information storage element of 1, wherein the arrangement has a total thickness in the range of about 20 nm to about 120 nm.

8. The information storage element of 1, wherein the arrangement has a total thickness in the range of about 30 nm to about 80 nm.

9. The information storage element of 1, wherein the arrangement has a total thickness of about 40 nm.

10. The information storage element of claim 1, wherein the first short-range order and the second short-range order have substantially the same chemical composition.

11. The information storage element of claim 1, wherein the first short-range order and the second short-range order have different electrical properties.

12. The information storage element of claim 11, wherein the electrical properties comprise electrical resistance of the arrangement.

13. The information storage element as claimed in claim 1, wherein the second layer the portion of $sp^3$ hybridized carbon is increased.

14. The information storage element as claimed in claim 1, wherein the arrangement further comprises a first graphite-like layer on one distal end portion of the arrangement.

15. The information storage element as claimed in claim 1, wherein the arrangement further comprises a first diamond-like layer on one distal end portion of the arrangement.

16. The information storage element as claimed in claim 14 wherein the arrangement further comprises a top layer on a second distal end portion of the arrangement, the second distal end portion opposing the one distal end portion, wherein the top layer is either diamond-like or graphite-like.

17. The information storage element as claimed in claim 15, wherein the arrangement further comprises a top layer on a second distal end portion of the arrangement, the second distal end portion opposing the one distal end portion, wherein the top layer is either diamond-like or graphite-like.

18. The information storage element as claimed in claim 1, further comprising at least one graphite-like layer.

19. The information storage element as claimed in claim 18, wherein the arrangement may have an arbitrary number of first, second, and graphite-like layers.

20. An information storage array, comprising a plurality of information storage cells, each information storage cell comprising:
an information storage element comprising a non-graphitic disordered carbon arrangement comprising a plurality of alternatingly arranged non-graphitic disordered carbon layers, wherein at least a first layer is formed in a first short-range order having a first ratio of $sp^2$ hybridized carbon and $sp^3$ hybridized carbon and at least a second layer is formed in a second short-range order having a second ratio of $sp^2$ hybridized carbon and $sp^3$ hybridized carbon, wherein the ratios are reversibly changeable; and a selection unit individually selecting the information storage element within the information storage array.

21. The information storage array of claim 20, further comprising:
at least one first control line; and at least one second control line; wherein each information storage cell is arranged between a respective first control line and a respective second control line.

22. The information storage array of claim 21, wherein the selection unit comprises at least one selection diode, the selection diode being arranged between a respective first control line and a respective second control line.

23. The information storage array of claim 20, wherein the selection unit comprises at least one selection diode or at least one selection transistor.

24. A method of operating an information storage element, the information storage element a non-graphitic disordered carbon arrangement comprising a plurality of alternatingly arranged non-graphitic disordered carbon layers, wherein at least a first layer is formed in a first short-range order having a first ratio of $sp^2$ hybridized carbon and $sp^3$ hybridized carbon and at least a second layer is formed in a second short-range order having a second ratio of $sp^2$ hybridized carbon and $sp^3$ hybridized carbon, wherein the ratios are reversibly changeable, the method comprising:

changing the first ratio and the second ratio, thereby changing the information storage status of the information storage element.

* * * * *